United States Patent
Ward et al.

(10) Patent No.: US 9,471,717 B2
(45) Date of Patent: Oct. 18, 2016

(54) REFLECTOR AND OPTICAL COATING FOR IMPROVED LED LIGHTING SYSTEM

(71) Applicant: GE Lighting Solutions, LLC., East Cleveland, OH (US)

(72) Inventors: Benjamin James Ward, East Cleveland, OH (US); Mark J Mayer, Sagamore Hills, OH (US); Koushik Saha, Brunswick, OH (US); Dengke Cai, Willoughby, OH (US); Gabriel Michael Smith, Cleveland, OH (US)

(73) Assignee: GE Lighting Solutions, LLC, East Cleveland, OH (US)

( * ) Notice: Subject to any disclaimer, the term of this patent is extended or adjusted under 35 U.S.C. 154(b) by 48 days.

(21) Appl. No.: 14/220,199

(22) Filed: Mar. 20, 2014

(65) Prior Publication Data

US 2015/0267894 A1   Sep. 24, 2015

(51) Int. Cl.
| | |
|---|---|
| *G06F 17/50* | (2006.01) |
| *F21V 7/00* | (2006.01) |
| *F21V 7/22* | (2006.01) |
| *F21Y 101/00* | (2016.01) |

(52) U.S. Cl.
CPC ............ *G06F 17/50* (2013.01); *F21V 7/0025* (2013.01); *F21V 7/22* (2013.01); *F21Y 2101/00* (2013.01)

(58) Field of Classification Search
CPC .. F21V 7/0025; F21V 7/0033; F21V 7/0041; F21V 7/10; F21V 7/22; F21V 7/00; F21V 7/04; G06F 17/50; G06F 17/5009; G02B 19/0009; G02B 19/0019; G02B 5/0816; G02B 5/085; G02B 5/0883
See application file for complete search history.

(56) References Cited

U.S. PATENT DOCUMENTS

| | | | | |
|---|---|---|---|---|
| 4,746,202 A | * | 5/1988 | Perilloux | G02B 5/0858 219/121.74 |
| 5,727,870 A | * | 3/1998 | Grierson | F21V 7/0008 362/225 |
| 6,254,241 B1 | * | 7/2001 | Unger | F21V 7/10 359/855 |
| 8,348,458 B2 | * | 1/2013 | Holten | F21V 3/04 362/231 |
| 8,481,148 B2 | * | 7/2013 | Adachi | G02B 1/115 351/159.01 |
| 2008/0084697 A1 | * | 4/2008 | Eberhard | F21S 8/02 362/297 |
| 2013/0114062 A1 | * | 5/2013 | Liesener | G01D 5/38 355/72 |

* cited by examiner

*Primary Examiner* — Bao Q Truong
(74) *Attorney, Agent, or Firm* — Peter T. DiMauro; GE Global Patent Operation

(57) ABSTRACT

Provided is a method including determining a first incident angle at which light from a light source will impinge on a first thin-film reflective stack of a planned first reflector for a lighting system. The method also includes determining a second incident angle at which light from the light source will impinge on a second thin-film reflective stack of a planned second reflector for the lighting system. The method further includes designing, using a processor executing a software package, the first reflector, comprising tuning a reflective characteristic of the first thin-film reflective stack as a function of the first incident angle determined, and designing, using the processor executing the software package, the second reflector, comprising tuning a reflective characteristic of the second thin-film reflective stack as a function of the second incident angle determined.

6 Claims, 3 Drawing Sheets

REFLECTOR AND OPTICAL COATING FOR IMPROVED LED LIGHTING SYSTEM

I. TECHNICAL FIELD

The present invention relates generally to light reflectors. More particularly, the present invention relates to reflector apparatus including optical coatings tuned for apparatus geometries and optics related to a light source such as a light-emitting diode (LED) array or cluster.

II. BACKGROUND

Traditionally, light-emitting diodes have been used mostly as indicator lights for a wide variety of devices. Due to advances in diode light intensity and color quality, modern LEDs are being used increasingly for area lighting applications, such as in indoor or outdoor lighting fixtures.

Reflectors for LED and other lighting systems are typically metal or at least metal coated. Metal reflectors for lighting applications, most commonly incorporating aluminum and more rarely silver or other metals on the reflective surface, are widely used because their reflectivity is largely insensitive to the incident angle of the light and they are amenable to the construction of a range of reflector shapes. Metals, though, exhibit limited reflectivity due to surface finish, degradation during processing (e.g. oxidation and surface contamination), and the application of protective coatings.

Other reflectors include a coating of thin films, such as polymeric or dielectric layers. The latter type can be referred to as a dielectric mirrors, or Bragg reflectors. A related term is a dichroic stack, mirror, or reflector.

Polymer stacks have shortcomings including relatively low robustness. Polymer stacks, being an example of non-dielectric stacks, can operate decently within only limited temperature range, for example. The polymer stacks can also break down when exposed to ultraviolet (UV) light, which can be generated by an LED or a high-intensity discharge (HID) light source. Non-dielectric stacks, e.g., polymer stacks, may also susceptible undesirably to water uptake and swelling.

Conventional dielectric optical stack reflectors are designed for reflecting optimally only light impinging on the reflector within a limited range of incident angles. An example range is centered about forty-five degrees (45°), such as a range of 40° to 50°. Especially with multi-component light sources, such as LED arrays or clusters within a single lighting apparatus, though, light rays can arrive at intra-apparatus reflectors at a wide variety of incident angles.

While conventional lighting systems are designed so that some reflectors, or portions of a reflector, receive light arriving within the optimal range, other reflectors or portions receive light at angles outside of the optimal range. Incident angles outside of the optimal angles can approach 0° on the low end and 90° on the other. Rays arriving outside of the optimal range reflect with an undesirable shift in color, and less-than-desirable intensity.

Losses in light quality (color and intensity) can be quantified. Turning to the figures and, more particularly to the first figure, FIG. 1 is a data chart 100 showing reflectivity, or reflectance (y-axis 102), or percentage of light reflected, of various wavelengths (x-axis 104) of two rays of light being the same, and reflecting off of the same surface, but at two different angles. A first 106 of the two rays impinges on the reflecting surface at 60° and a second ray 108 impinges at only 15°.

As can be seen in FIG. 1, a relatively high percentage of the light between about 380 nanometer (nm) and 625 nm wavelengths is reflected for both rays 106, 108 (i.e., at both angles). Wavelengths at the lower end of the visible spectrum, e.g., from slightly above 400 nm to below, include indigo and violet, while orange starts at the other end from yellow around 600 nm, transitioning to more red approaching and exceeding 650 nm.

Within this context, FIG. 1 depicts that while the reflectivity, or reflectance 102 (y-axis value) for the first ray 106 (the 60° incident ray) remains high for even the higher, more red, wavelengths of the ray 106, the reflectance for the second ray 108 (the 15° incident ray) plummets for the higher wavelengths of the ray 108. The result is undesirable color, including insufficient red light, and, so, less overall intensity and color uniformity for the light 108 being reflected after arriving at the lower angle.

III. SUMMARY OF THE EMBODIMENTS

Given the aforementioned deficiencies, there is a need for an improved lighting system having high-performance coatings tuned to system geometries and optics to reflect light to high intensities without undesired color separation.

In at least one embodiment, the present technology provides a method, comprising determining a first incident angle at which light from a light source will impinge on a first thin-film reflective stack of a planned first reflector for a lighting system, and determining a second incident angle at which light from the light source will impinge on a second thin-film reflective stack of a planned second reflector for the lighting system. The method also includes designing, using a processor executing a software package, the first reflector, including tuning a reflective characteristic of the first thin-film reflective stack as a function of the first incident angle determined, and designing, using the processor executing the software package, the second reflector, including tuning a reflective characteristic of the second thin-film reflective stack as a function of the second incident angle determined.

In one embodiment, the reflective characteristic includes a total stack thickness, designing the first reflector comprises tuning a first total thickness, of the first thin-film reflective stack, as a function of the first incident angle determined, and designing the second reflector comprises tuning a second total thickness, of the second thin-film reflective stack, as a function of the second incident angle determined.

In an embodiment, determining the first incident angle comprises determining the first incident angle to be within a relatively high angle range, determining the second incident angle comprises determining the second incident angle to be within a relatively low angle range, and designing the first reflector comprises tuning the first total thickness, of the first thin-film reflective stack, to be greater than the second total thickness, of the second thin-film, based on the first incident angle being within the relatively high angle range and greater than the second incident angle being within the relatively low angle range.

In an embodiment, the relatively high range comprises angles between about 45° and about 90°, and the relatively low angle range comprises angles between about 0° and about 30°.

In one embodiment, the reflective characteristic comprises a thickness of at least one thin-film reflective stack layer, designing the first reflector comprises tuning a first thickness, of at least one layer of the first thin-film reflective stack, as a function of the first incident angle, and designing the second reflector comprises tuning a second thickness, of a corresponding at least one layer of the second thin-film reflective stack, as a function of the second incident angle.

In an embodiment, the reflective characteristic includes a number of thin-film stack layers.

In an embodiment, designing the first reflector comprises tuning a first number of thin-film layers, of the first thin-film reflective stack, as a function of the first incident angle determined.

In one embodiment, designing the second reflector comprises tuning a second number of thin-film layers, of the second thin-film reflective stack, as a function of the second incident angle determined.

In one embodiment, the reflective characteristic includes a thin-film stack material, designing the first reflector comprises selecting a first material, for the thin-film layers of the first thin-film reflective stack, as a function of the first incident angle determined, and designing the second reflector comprises selecting a second material, for the thin-film layers of the second thin-film reflective stack, as a function of the second incident angle determined.

In another aspect, the present technology includes a multi-reflector lighting apparatus, comprising a first reflector having a first thin-film reflective stack, wherein the first reflector, when positioned for operation within the apparatus, will reflect light arriving at a first incident angle from a light source. The apparatus also includes a second reflector having a second thin-film reflective stack, wherein the second reflector, when positioned for operation within the apparatus, will reflect light arriving at a first incident angle from the light source. The first thin-film reflective stack comprises a reflective characteristic tuned as a function of the first incident angle. And the second thin-film reflective stack comprises the reflective characteristic tuned as a function of the second incident angle.

In one embodiment, the apparatus further include the light source including multiple light emitting diodes.

In one embodiment, the first incident angle is within a relatively high angle range and the second incident angle is within a relatively low angle range.

In an embodiment, the relatively high range comprises angles between about 45° and about 90°, and the relatively low angle range comprises angles between about 0° and about 30°.

In one embodiment, the reflective characteristic comprises a thin-film reflective stack thickness, a first thickness, of a layer of the first reflective stack, is based on the first incident angle, and a second thickness, of a corresponding layer of the second reflective stack, is based on the second incident angle.

In one embodiment, at least one reflective characteristic includes a number of thin-film stack layers, a first number of thin-film layers, of the first thin-film reflective stack, is a function of the first incident angle, and a second number of thin-film layers, of the second thin-film reflective stack, is a function of the second incident angle.

In one embodiment, the at least one reflective characteristic includes a thin-film reflective stack material, a first material, of a layer of the first thin-film reflective stack, is a function of the first incident angle, and a second material, of a corresponding layer of the second thin-film reflective stack, is a function of the second incident angle.

In still another aspect, the present technology includes a computer-readable storage device, comprising computer-executable instructions that, when executed by a processor, cause the processor to perform various operations. The operations include determining a first incident angle at which light from a light source will impinge on a first thin-film reflective stack of a planned first reflector for a lighting system. The operations also include determining a second incident angle at which light from the light source will impinge on a second thin-film reflective stack of a planned second reflector for the lighting system, and designing the first reflector, including tuning a reflective characteristic of the first thin-film reflective stack as a function of the first incident angle determined. The operations also include designing the second reflector, including tuning the reflective characteristic of the second thin-film reflective stack as a function of the second incident angle determined.

In an embodiment, the reflective characteristic includes a total stack thickness, the operation of designing the first reflector comprises tuning a first total thickness, of the first thin-film reflective stack, as a function of the first incident angle determined, and designing the second reflector comprises tuning a second total thickness, of the second thin-film reflective stack, as a function of the second incident angle determined.

In one embodiment, the operation of determining the first incident angle comprises determining the first incident angle to be within a relatively high angle range, determining the second incident angle comprises determining the second incident angle to be within a relatively low angle range, and designing the first reflector comprises tuning a first total thickness, of the first thin-film reflective stack, to be greater than a second total thickness, of the second thin-film, based on the first incident angle being within the relatively high angle range and greater than the second incident angle being within the relatively low angle range.

In another embodiment, the reflective characteristic comprises a variable selected from a group of variables consisting of a thin-film reflective stack thickness, a thin-film reflective stack number of layers, and a thin-film reflective stack material.

Further features and advantages, as well as the structure and operation of various embodiments, are described in detail below with reference to the accompanying drawings. The invention is not limited to the specific embodiments described herein. The embodiments are presented for illustrative purposes only. Additional embodiments will be apparent to persons skilled in the relevant art(s) based on the teachings contained herein.

IV. BRIEF DESCRIPTION OF THE DRAWINGS

Example embodiments may take form in various components and arrangements of components. Example embodiments are illustrated in the accompanying drawings, throughout which like reference numerals may indicate corresponding or similar parts in the various figures. The drawings are only for purposes of illustrating preferred embodiments and are not to be construed as limiting the invention. Given the following enabling description of the drawings, novel aspects of the present invention will be evident to a person of ordinary skill in the art.

Figure 2:
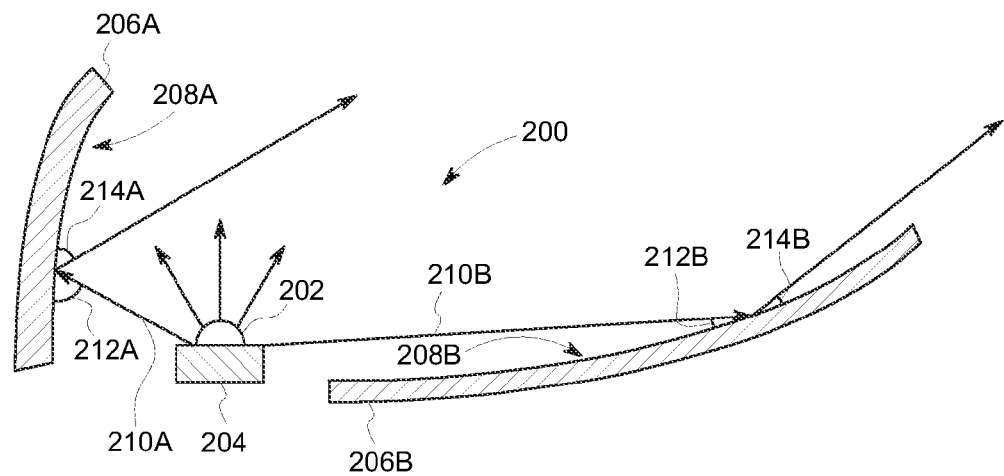
FIG. 2 illustrates schematically a lighting system or assembly according to the present technology.
Figure 3:
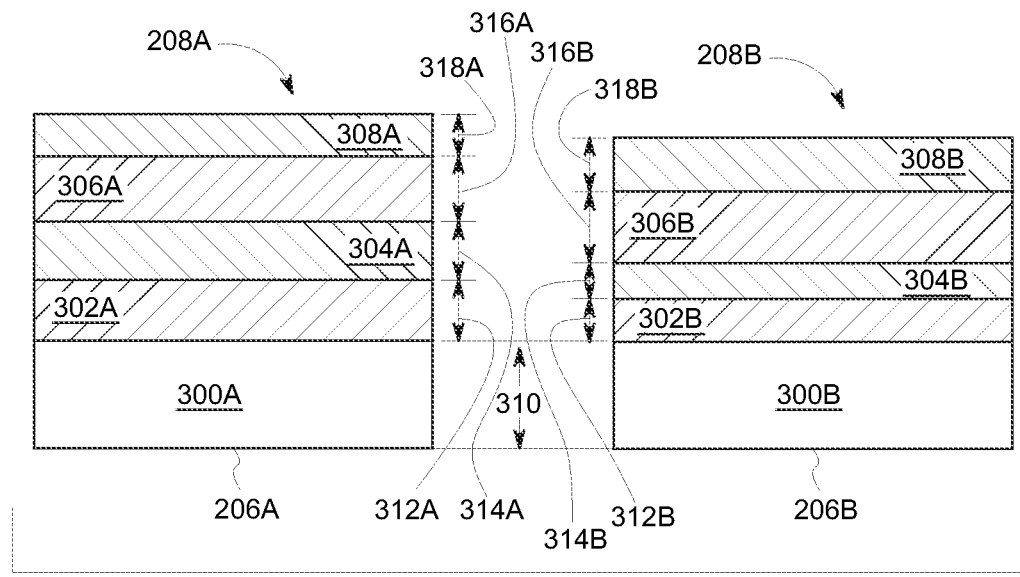

FIG. 3 includes a partial cross-sectional view of a first reflector coating of the lighting system of FIG. 2 adjacent a partial cross-sectional view of a second reflector coating of the reflective system.

Figure 4:
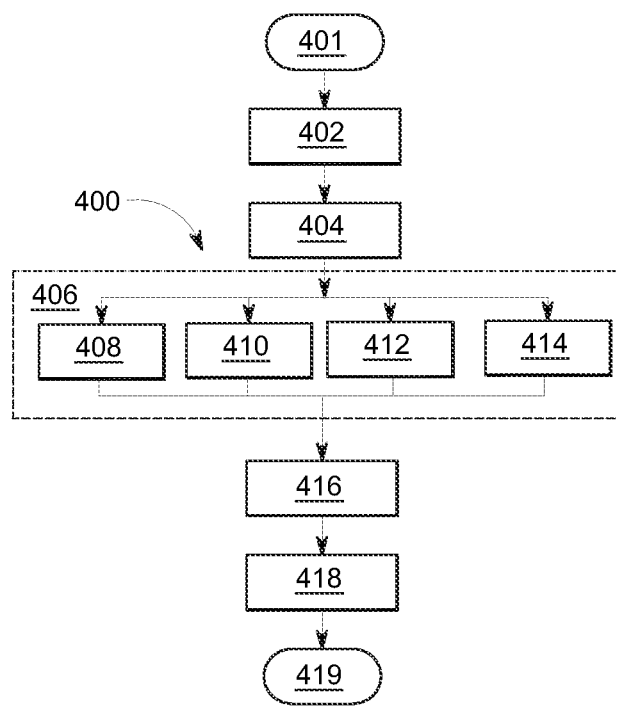

FIG. 4 is a schematic illustration of a method for producing the lighting system.

Figure 5:
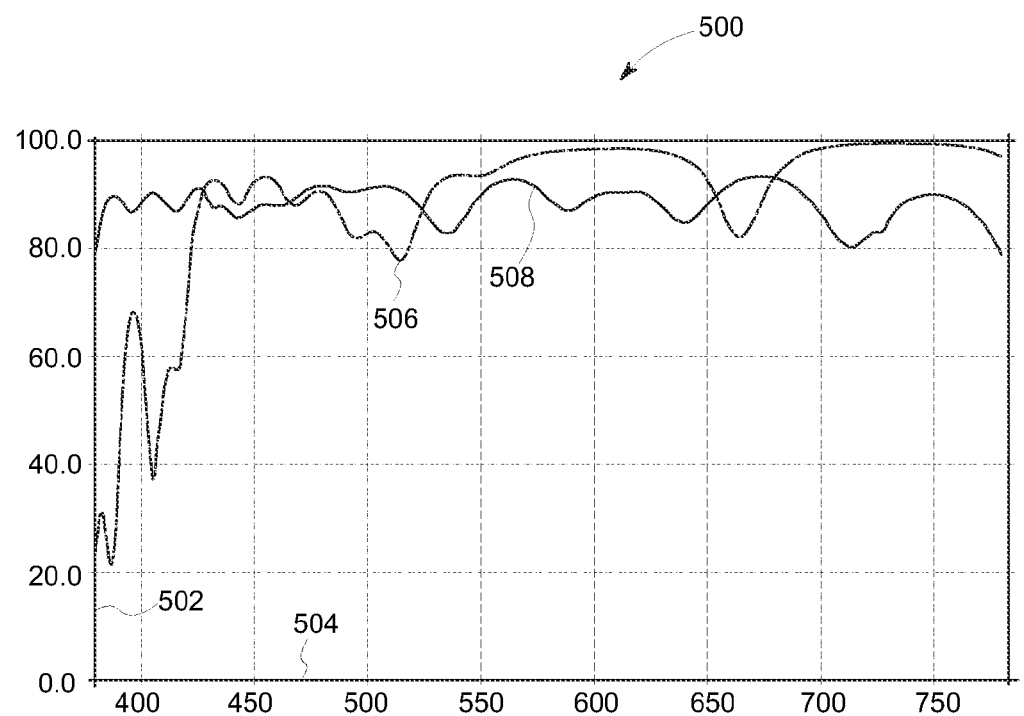

FIG. 5 is a chart showing reflectance vs. wavelength for two instances of reflected light, a first being incident at a lower angle to a reflector tuned to a geometry and optics of the lighting system, and the other being incident at a higher angle to a distinct reflector also tuned to the geometry and optics of the lighting system.

V. DETAILED DESCRIPTION OF THE EMBODIMENTS

While illustrative embodiments are described herein with illustrative embodiments for particular implementations, it should be understood that the invention is not limited thereto. Those skilled in the art with access to the teachings provided herein will recognize additional modifications, applications, and embodiments within the scope thereof, and additional fields in which the lighting systems, and included reflector coatings, described herein would be of significant utility.

Lighting System Overview—FIG. 2

Turning again to the figures and, more particularly to the second figures, FIG. 2 shows portions of a lighting assembly system 200. The system 200 includes a light source 202 connected to a base or mount 204. While a single light component or element 202 is shown schematically for simplicity of illustration, the light source can include multiple diodes (e.g., LEDs), bulbs, or other lighting elements.

For embodiments in which the light source 202 includes multiple elements, the elements may be arranged in any conventional or to-be-created manner, such as in a lighting array or cluster. Multiple-element arrangements can still be referred to as a (single) light source, herein, for instance.

The lighting system 200 illustrated can be referred to as a multi-reflector system, having multiple reflectors 206A, 206B. While two reflectors 206A, 206B are shown, the lighting system 200 in various embodiments includes any number of distinct reflectors, whether any of the reflectors are connected directly to each other.

The system 200 in one embodiment (not shown in detail) includes a single reflector component, e.g., an asymmetrical reflector. However, and while multiple reflectors 206A, 206B are shown schematically as separate components, two or more of the reflectors 206A, 206B are in some embodiments connected to each other, e.g., directly. The combined reflector of such embodiments, including, e.g., each illustrated reflector component 206A, 206B of FIG. 2, may share a common substrate or have connecting substrates, for instance.

In embodiments of the present technology, two or more of the reflectors 206A, 206B are coated with distinct multilayer thin-film reflective stacks 208A, 208B. Each stack 208A, 208B can include distinct types of layered reflectors—e.g., dielectric mirrors, Bragg reflectors, or dichroic mirrors. The stacks 208A, 208B in these embodiments include multiple relatively thin stacked layers or films of, e.g., dielectric material. As described more below, materials of the stacks in some embodiments preferably alternate between a material having a relatively high refractive index and one having a relatively low refractive index.

Configurations of high-performance reflectors 206A, 206B are tuned to aspects of a geometry of the lighting system 200 and optics, as described further below in connection with FIG. 3. In some embodiments, it is preferred to tune the reflectors 206A, 206B using design software, or a software package configured for the purpose. The software package, e.g., a simulation program, is also described more below, in connection with the method 400 of FIG. 4.

Before the lighting system 200 is described further, it is noted that some aspects of the system that are not needed for the present description, yet which are used in system operation, construction, or positioning for operation, are not illustrated. For instance, a cover, e.g., cover lens, of the lighting system 200 is not shown, or components connecting the light source 202 to the reflectors 206A, 206B.

With continued reference to FIG. 2, multiple example light rays are shown schematically, including first and second rays 210A, 210B. The two rays 210A, 210B called out impinge on the first and second reflectors 206A, 206B, respectively. The light rays 210A, 210B arrive, more particularly, at the coatings 208A, 208B of the reflectors 206A, B, and at respective approach, or incident, angles 212A, 212B. The rays 210A, 210B leave the coating 208A, 208B at respective departure angles 214A, 214B.

Thin-Film Reflective Stack in More Detail—FIG. 3

Turning to the third figure, FIG. 3 shows partial cross sections of the two example reflectors 206A, 206B of the lighting system 200 in FIG. 2. Each reflector 206A, 206B includes a substrate, or base reflector surface 300A, 300B. The base reflector surfaces 300A, 300B may include any of a variety of materials. In one embodiment, one or both base surfaces 300A, 300B are non-reflective or minimally reflective. In one embodiment, one or both base surfaces 300A, 300B are reflective. As an example of the latter case, one or both base surfaces 300A, 300B can include aluminum or silver.

Though the reflectors 206A, 206B are shown unconnected in FIG. 2, all or portions of the two or more reflectors 206A, 206B can be combined, as mentioned. While the implementation is not illustrated expressly, the reflectors 206A, 206B may share a common substrate 300A, 300B or having connected substrates.

As shown in FIG. 3, each thin-film reflective stack 208A, 208B includes multiple layers positioned directly adjacent (i.e., directly atop, in the view of FIG. 3) the reflector base 300A, 300B.

Various characteristics or factors define each stack 208A, 208B. Characteristics include a number, size (e.g., thickness), shape, and material of stack layers. One or more of the characteristics are, according to the present technology, a function of lighting system 200 geometry and optics.

The system geometry factors can include a configuration (e.g., size and shape) and arrangement (e.g., positioning and orientation) of the reflectors 206A, 206B in the system 200.

The optical factors can include at least those resulting from the system geometry, such as the incident angles of light on the light stack 208A, 208B. The optical factors can also include color presence or distribution (e.g., wavelength range, or median wavelength, etc.) of the light to arrive at the stacks.

While each stack 208A, 208B is shown to include four layers each, for illustrative purposes, the stacks can include any desired number of layers. The number of layers can be even or odd. The number in some embodiments, is greater than four—e.g., five layers, ten layers, fifteen layers, twenty layers, numbers between these, or greater than these. In one embodiment, each stack 208A, 208B includes an odd number of layers greater than twenty—e.g., 23 layers, 25 layers, 27 layers, 29 layers, 31 layers, etc.

The layers can include any of a variety of materials. In some embodiments, each layer consists preferably of a dielectric material. In some embodiments, each stack 208A, 208B includes at least two different material layers, such as two different dielectric materials. The layers can vary by is their characteristic of refractive index. In a contemplated embodiment, at least one of the layers is a non-dielectric.

In one embodiment, the layers of each stack 208A, 208B include alternating layers of a first material (e.g., first dielectric material) having a relatively high refractive index and a second material (e.g., second dielectric material) having a relatively low refractive index. In this alternating arrangement, each relatively high refractive index material can be the same, and each relatively low refractive index material can be the exact same, but that need not be the case in every implementation.

For some implementations, it is preferred that the number of layers be odd. In at least one of those implementations, it is preferred that the lowest layer, directly adjacent the base surface 300A, 300B include a relatively low refractive index film, and so that the final layer (e.g., top layer) include a relatively low refractive index film.

For some implementations, it is preferred that the number of layers be odd. In at least one of those implementations, it is preferred that the lowest layer, directly adjacent the base surface 300A, 300B include a relatively high refractive index film, and so that the final layer (e.g., top layer) also include a relatively high refractive index film.

For some implementations, it is preferred that the number of layers be even. In at least one of those implementations, it is preferred that the lowest layer, directly adjacent the base surface 300A, 300B include a relatively low refractive index film and that the final layer (e.g., top layer) include a relatively high refractive index film. For some implementations having an even number of layers, it is preferred that the lowest layer, directly adjacent the base surface 300A, 300B include a relatively high refractive index film and that the final layer (e.g., top layer) include a relatively low refractive index film.

Each of the stacks 208A, 208B, in a contemplated embodiment, terminates at a superstrate, or cover surface (not illustrated), opposite the substrate or base surface 300A, 300B. A superstrate could function to, e.g., limit environmental effects on the stack 208A, 208B.

The refractive index (n) of a material is the ratio of the speed of light in vacuum (c) and the speed of light within the material (v), or n=c/v. While the materials used in an dielectric stack may have other refractive indexes, in one of the embodiments having an alternating high-index/low-index arrangement, relatively high refractive indexes are between about n=2.2 and about n=2.6 nm—e.g., about n=2.4, and relatively low refractive indexes are between about n=1.2 and about n=1.8—e.g., about n=1.5.

Continuing with the example of FIG. 3, the stacks 208A, 208B begin with a low, or least relatively low, refractive index layer 302A, 302B positioned directly adjacent, and contacting directly, the substrates 300A, 300B, respectively. According to the alternating arrangement, the next layers 304A, 304B are thus have a high, or relatively high, refractive index.

The final two layers illustrated are, then, continuing with the alternating arrangement, low refractive index layers 306A, B and high refractive index layers 308A, B.

The layers 302A/B, 304A/B, 306A/B, 308A/B of the stacks 208A, 208B can also be set to any of a wide variety of thicknesses. In FIG. 3, a thickness of the substrate 300A, 300B is identified by reference numeral 310. Thicknesses of the layers 302A/B, 304A/B, 306A/B, 308A/B are referenced by numerals 312A, B, 314A, B, 316A, B, and 318A, B, respectively.

Layer thicknesses for each implementation can be represented by, e.g., a linear measure, such as nanometers (nm) or millimeters (mm).

In one embodiment, each layer 302A/B, 304A/B, 306A/B, 308A/B of the stacks 208A, 208B has a thickness of between about 100 nm and about 200 nm. The substrate, or base surface 300A, 300B, and any superstrate are in some cases much thicker. In one embodiment, for example, the substrate has a thickness between about 400 nm and about 600 nm—e.g., about 500 nm. Any superstrate can be of similar thickness.

As provided, at least one characteristic of the reflectors 206A, 206B, such as overall stack thickness, thickness of one or more layers, material of one or more layers, or number of layers, can be tuned (e.g., configured, arranged, designed, or defined according) to lighting system 200 geometry and optics within the system.

Again, the geometrical factors can include a configuration (e.g., size and shape) and arrangement (e.g., positioning and orientation) of the reflectors 206A, 206B in the system 200. And the optical factors can include at least those resulting from the system geometry, such as the incident angles of light on the stack 208A, 208B. In addition, the optical factors may also include color presence or distribution (e.g., wavelength range, or median wavelength, etc.) of the light arriving at the stacks.

The relationship between any dependent characteristic of the reflectors 206A, 206B and the geometry of or optics within the system 200 can be phrased in other ways, in addition to saying that the prior is a function of the latter, such as by saying that the prior is based on the latter, that the prior is tuned to, or tuned based on the prior, that the prior depends, or is dependent, on the latter, that the prior is controlled, defined, or dictated by the prior, or the like.

In embodiments, goals of the reflector tuning (e.g., reflector stack tuning) include maximizing reflectivity and minimizing color separation of the light being reflected by each reflector 206A, 206A.

A primary reflector stack characteristic to be tuned is, in many embodiments, the thickness of the stack layers 302A, B, 304A, B, 306A, B, 308A, B. More particularly, the thickness for one or more of the layers of each reflector component is pre-selected based on an expected angle or angles (or angle range) of incidence at which light from the source (e.g., source 202 in FIG. 2) will impinge on the stack 208A, 208B.

Most lighting systems result in emitted light propagating toward the reflector(s) along multiple lines. For these cases, calculations are configured to accommodate these realities. Calculations can be configured to consider, e.g., an angle at which most light will be incident on the stack, or an average or median angle at which light will be incident on the stack, the like or other approaches.

Further regarding tuning stack thicknesses, various stacks can be tuned differently based at least on their being at different places within the system geometry. At least one of the thicknesses 312A, 314A, 316A, 318A of the layers 302A, 304A, 306A, 308A of the first reflector 206A differs from a corresponding thickness or thicknesses 312B, 314B, 316B, 318B of the layers 302B, 304B, 306B, 308B of the second reflector 206B.

In some embodiments a thin-film stack, and/or just one or more layers thereof, will be configured thicker if, based on system geometry, light rays (e.g., most of the incident light)

will impinge on the stack at higher incident angles. And vice versa—i.e., a thin-film stack, and/or just one or more select layers thereof, will be configured thinner if light rays will impinge on the stack at lower incident angles.

Thickness of a stack, and layers therein, affect how light rays are refracted within and so reflected by the reflector. A thinner stack will result in very-high quality light and color output (i.e., maximizing reflectivity and minimizing color separation) for light rays arriving, based on system geometry, at the reflector at only glancing or grazing incident angles. The optical benefits relate to wave theory and how the tuned layers refract light as desired in the reflecting act.

Conversely, then, a thicker stack will result in high-quality light and color output (i.e., maximizing reflectivity and minimizing color separation) for system 200 geometries by which light rays will arrive at the reflector at only closer-to-normal incident angles.

Output from each reflector, receiving light at different angles from the source, is a desired pattern of light, e.g., a full pattern resulting in a desired bright white appearance, directed to the target area, such as the ground for an overhead parking-lot light fixture. The beam pattern in most embodiments should include the constituent wavelengths (i.e., colors) in an equally distributed manner.

As an example of thickness variations, with continued reference to FIGS. 2 and 3, for instance, at least one of the thicknesses 312A, 314A, 316A, 318A of the layers 302A, 304A, 306A, 308A of the first reflector 206A is less than a corresponding thickness/thicknesses 312B, 314B, 316B, 318B of the layers 302B, 304B, 306B, 308B of the second reflector 206B in response to a pre-determined geometry of the system 200 calling for the first and second reflectors 206A, B being arranged (e.g., positioned and oriented) in the system 200 so that light 210A from the source 202 will arrive at the first stack 208A at an incident angle 212A that is less than an incident angle 212B of light 210B to arrive at the second stack 208B.

With further reference to FIGS. 2 and 3, the incident angle 212A of the first called-out ray 210A at the reflector 206A is relatively large, being approximately 60°. Some portions of the same reflector 206A receive light from the source 202 at greater incident angles, up to even about 90° (toward the lower edge of the reflector 206A in FIG. 2), for example, and at slightly lower angles, down to perhaps about 45° or 50° (toward the lower edge of the reflector 206A in FIG. 2).

Light incident on a surface at such relatively high angles (e.g., 60°-90°, or a range including slightly lower angles, such as down to 55°, 50°, or 45°), can be referred to as near-normal, or nearer-normal, angles (or near-normal angle range), as these angles are relatively larger, closer to 90° than much lower angles.

The incident angle 212B of the second called-out ray 210B, at the second reflector 206B, is relatively small, being approximately 15°, and perhaps up to 20° on the high end. Some portions of the same reflector 206B receive light from the source 202 at lower angles, down to perhaps about 10°—e.g., toward the lower edge of the reflector 206A in FIG. 2.

Light incident on a surface at such relatively low angles (e.g., 10°-20°, or a range including slightly higher or lower angles, such as down to about 5° or even approaching 0°), can be referred to as glancing, or grazing angles, or a glancing or grazing angle range.

According to the relationship described above, with the geometry and optics of the system 200 being such that light 210A will impinge on the first stack 208A at nearer-normal angles 212A and light 210B will impinge on the second stack 208B at more glancing angles 212B, the first stack 208A, or at least one or more layers thereof, would be designed thicker than the stack 208B, or corresponding layers thereof.

With reference to FIG. 3, the first stack 208A is shown being thicker overall (from top to bottom in the figure) than the overall thickness of the second stack 208B, based on the relative profiles of incident angles on the stacks 208A, B.

As mentioned, along with or instead of the overall thickness of the first stack 208A being larger, one or more of the layers may be thicker based on the relative profiles of incident angles. In FIG. 3, the first layer 302A (e.g., relatively low index layer) of the first stack 208A has a thickness 312A greater than a thickness 312B of a corresponding first layer 302B (e.g., same relatively low index layer) of the second stack 208B.

In FIG. 3, the second layer 304A (e.g., relatively high index layer) of the first stack 208A has a thickness 314A being greater than a thickness 314B of a corresponding first layer 304B (e.g., same relatively high index layer) of the second stack 208B.

The third and fourth layers 306A/B, 308A/B are shown as being generally the same size for each stack 208A, 208B. In one implementation, one or more of the layers of the larger stack 208A can be thinner than the corresponding layers of the shorter stack 208B.

Four-layer stacks are shown by way of illustration and not limitation, as mentioned, and the stacks 208A, 208B can include any desired total number of layers, even or odd—e.g., five layers, ten layers, twenty layers, numbers between these, or more. In various embodiments, one or both stacks 208A, 208B include 23 layers, 25 layers, 27 layers, 31 layers, etc.

And while distinctions are drawn primarily in the examples above between just two reflectors: a first 206A configured and arranged to receive nearer-normal angle light and the other 206B to receive more glancing-angle light, it will be appreciated that the scenarios may be more complex. The system 200 may include more than two reflectors 206A, 206B, for instance.

In one embodiment (not shown in detail), the system 200 comprises a single reflector, having only one type of stack (e.g., 208A or 208B), tuned according to the principles of the present disclosure. This embodiment can be distinguished from the described embodiment in which different stacks are combined into a single reflector, such as by the distinct stacks sharing a common substrate or having connected substrates.

The stack (208A or 208B) of the single reflector (206A or 206B) can include dielectric layers having thicknesses tuned based on the geometry and optics. The optics may include, e.g., incident light angle, or angle or angle range at which most light from the source will impinge on the stack (208A or 208B), and perhaps also color characteristics, e.g., distribution/levels of color (wavelengths) incoming and desired for outgoing.

In one embodiment (not shown in detail), e.g., at least three reflectors (e.g., 206A, 206B and a third) are configured and arranged in the system 200 so that (i) some rays of light would arrive at near-normal angles at a first of the reflectors, (ii) other rays of light would arrive at more-glancing angles at a second of the reflectors, and (iii) still other rays of light would arrive within an angle range being generally lower than those of the first arrangement (i) and higher than those of the second arrangement (ii). The angles of the third arrangement (iii) could define near-normal angles, but just farther from normal than the first arrangement (ii), or could define glancing angles, but just higher angles than the second arrangement (ii). In this case, assuming the primary function described, above, the stack for the first stack of these three would have the greatest thickness (or one or more relatively thicker layers) of the three, the third stack would have the smallest thickness (or one or more layers relatively thinner) of the three, and the second stack would have a thickness (or layer thicknesses) intermediate that of the first and third stacks.

As another, contemplated, extension of the primary, two-reflector (206A, 206B) example, a single reflector can include two or more stacks 208A, 208B formed adjacent each other, or formed separately and connected or positioned directly adjacent each other. For these contemplated scenarios, the stacks may be formed on a common substrate, simultaneously or at separate times, such as using a separating mask, or formed separately on distinct substrates that are then connected or at least positioned adjacent each other.

In contemplated embodiments, at least one characteristic of the reflector (e.g., the stack) in addition to or instead of thickness, such as number of layers or material of one or more layers, is tuned (e.g., configured, arranged, designed, or defined as) to lighting system geometry and optics within the system. A goal for the contemplated embodiments can be essentially the same as the goals described above. For instance, one or more stack layer materials can be selected (or tuned) and/or a number of layers selected (or tuned) so that, based on system 200 geometry and optics, light rays are refracted within and so reflected overall by the reflector towards very-high quality light output and very-high quality color output (i.e., maximizing reflectivity and minimizing color separation). The tuning will result in one configuration (e.g., material(s) selection, number of layers, and/or layer thickness) for stacks onto which light rays will be more glancing, another when incident angles at the stack would be nearer to normal, and others are possible for any scenarios there between.

In one contemplated embodiment, in addition to or instead of one or more reflector characteristics being tuned as a function of system 200 geometry and intra-system optics, at least one aspect of system geometry and/or optics is tuned as a function of reflector characteristics. For instance, configuration (e.g., sizing, shaping) band/or arranging (e.g., positioning and/or orientation) of a reflector can be set based at least in part on reflector characteristics, such as the thickness, material, or number of layers of the reflector stack. The resulting goals would be like those described above—e.g., to achieve a very-high quality light and color output (i.e., maximizing reflectivity and minimizing color separation).

Method of System Formation—FIG. 4

Turning to the fourth figure, FIG. 4 shows schematically a flow of a process or method 400 for forming a lighting system, or aspects thereof, according to the present technology. The flow illustrated and described includes algorithms for performing various operations.

It should be understood that the steps of the method 400 are not necessarily presented in any particular order and that performance of some or all the steps in an alternative order is possible and is contemplated. The steps are presented in the demonstrated order for ease of description and illustration. Steps can be added, omitted and/or performed simultaneously without departing from the scope of the appended claims. The illustrated method 400 could be ended at any time.

One or more of the operations of the method 400 are in various embodiments performed by a server or other computer, such as one including a processor executing computer-executable instructions or code stored on a computer-readable storage device that is part of or remote to and in at least selective communication with the processor.

The method 400 begins 401 and flow proceeds to a first, and optional, block 402, whereat a software package is obtained for performing aspects of the method. Obtaining the software in some embodiments includes retrieving, or otherwise receiving, the package. In some embodiments, the step 402 includes generating the package. Obtaining the software is referenced more below.

From block 402, flow proceeds to block 404 whereat a design of the lighting system 200 is obtained. Obtaining the design may include retrieving, or otherwise receiving, the design, being pre-generated, such as from a local or remote computer memory.

Obtaining the design may include generating the design. In some embodiments, generating the design is performed using a computing device having a processor executing custom software, such as that of step 402, tailored to the task of designing aspects of the system 200.

Such design software can receive variables and/or values for variables as inputs and some variables can be set to be outputs. For instance, in one embodiment, the user inputs a planned or expected quality and incident angle for light impinging on a reflector, along with a desired light output (if not default white), and the software determines a number of dielectric layers to use and their materials and thicknesses.

It should be appreciated that there are an infinite number of combinations, or permutations, of stack characteristics—i.e., combinations of various numbers of layers, thicknesses of layers, materials, etc. The software limits the possibilities—based on the parameters set, including inputs, such as system geometry and optics mentioned—to a recommended combination, or recipe for the particular stack.

Generally, the lighting system variables that can be obtained (e.g., generated) in this step 404, whether via computer, include any feature of the lighting system. System variables can include, for instance, a type and an arrangement—e.g., positioning and orientation—of light source(s) to be used in the system. The variables can also include a number and arrangement of reflector components to be used in the system.

Regarding the type of the light source, while a single lighting component 202 is shown schematically for simplicity of illustration in FIG. 2, the light source can include multiple bulbs, diodes, or other lighting elements, as mentioned. The light source(s) can be designed to each emit light at any desired color or color combination. For embodiments in which the light source 202 includes multiple lighting elements, the elements may be arranged in any conventional or to-be-created manner, such as in a lighting array or cluster.

In some embodiments, some system variables are set (in, e.g., the software), not be tuned. In an embodiment in which only stack thickness will be tuned, for instance, any or all other lighting-system design variables (e.g., material, number of layers) can be set, or static, for the generating operation.

The system variables are, in one embodiment, set (via, e.g., the software) for the generating according to desired system qualities, such as direction and intensity of system output light. Other qualities considered can include, e.g., system weight, size, shape, and cost.

As mentioned, in some implementations of the method 400, in which a software package is used to obtain 404 the lighting system 200 geometry and optics, the method can first include, before using the package (e.g., step 404), obtaining (e.g., creating) the package at step 402. In one embodiment, the software package may be referred to as a simulation program, as it simulates system 200 performance at least mathematically in calculating desired output data for configuring the reflector configurations and/or arrangements.

As also mentioned, in one embodiment (not illustrated expressly in FIG. 4), one or more aspects of the system design and optics can be tuned as a function of (or based on, controlled by, dependent on, etc.) reflector characteristics. For instance, as an example, based on a determination to, in step 404 or before, use a certain type of reflector stack, or base substrate, a positioning or orientation of the reflector and/or of the light source of the lighting system can be set.

From block 404, flow proceeds to block 406 whereat at least one reflector characteristic is tuned to lighting system 200 geometry and optics within the system obtained at block 404. As referenced, the tunable characteristics can include, e.g., stack thickness, thickness of one or more stack layers, material of one or more layers, and number of layers.

The relationship(s) between any dependent characteristic of the reflectors 206A, 206B (e.g., stack thickness) and the geometry of, or optics within, the system 200 can be phrased in other ways, in addition to saying that the prior is a function of the latter, such as by saying that the prior is based on the latter, that the prior is tuned to, or tuned based on the prior, that the prior depends, or is dependent, on the latter, that the prior is controlled, defined, or dictated by the prior, or the like.

Again, the geometric factors of the lighting system 200 available for consideration can include a configuration (e.g., size and shape) and arrangement (e.g., positioning and orientation) of the reflectors 206A, 206B in the system 200.

The optical factors can include at least those resulting from the system geometry, such as the incident angles of light on the light stack 208A, 208B.

The optical factors can also include color presence or distribution (e.g., wavelength range, or median wavelength, etc.) of the light to arrive at the stacks. LEDs for instance, can include various color dyes, having various light outputs. In some cases, the light source, e.g., LED, includes multiple dyes, or otherwise exhibits various separation patterns, or color properties, in the light leaving the source for the reflector(s).

Reflector characteristics, such as stack layer thickness(es) or number of layers, can be tuned based in part on the type of light to arrive at the stack. In some implementations, a non-white lighting effect is desired, such as if a light with more blue or more red, after reflection, is desired. Thus, whether white light or another type is desired as output, the desired light output quality/ies can, along with quality/ies of the light input, be considered as a factor upon which the stack tuning is be based.

Stated goals of the tuning 406 include maximizing reflectivity and minimizing color separation of the light being reflected by each reflector 206A, 206A.

A primary reflector characteristic described above as being tunable according to the present technology is the thicknesses of the stacks 208A, 208B, or at least thicknesses of layers of the stacks. Tuning stack thickness is indicated in FIG. 4 by reference numeral 408. Regarding tuning the thickness of each stack 208A, 208B, each stack thickness, or layer(s) thereof, are configured based on lighting system 200 geometry and optics.

Stack thickness tuning 408 is in some embodiments performed using a custom software package. The software package can be the same as or different from that described above in connection with operations 402 and 404. In either event, the software can be generated or otherwise obtained.

The tuning of stack thicknesses is described above in connection with FIGS. 2 and 3. As provided, an angle or angle range of most light to impinge on a reflector, or a median or an average angle of all of the light that will impinge on the reflector, is considered in configuring the thickness of the stack 208A, B or of one or more layers of the stack. As also described, regarding tuning stack thickness based on system geometry and optics, in some embodiments, a thin-film stack, and/or just one or more layers thereof, will be configured thicker if light rays (e.g., most of the incident light) will impinge on the stack at more glancing incident angles. And vice versa—i.e., a thin-film stack, and/or just one or more select layers thereof, will be configured thinner if light rays will impinge on the stack at more perpendicular incident angles. Example angle ranges (e.g., glancing angle ranges and nearer-normal angle ranges) are described above. FIGS. 2 and 3 show the stacks 208A, B of the reflectors 206A, B being thicker (stack 208A) and thinner (stack 208B), respectively, according to a tuning of the present technology, based on at least intra-system geometry.

Stack thickness tuning 408 is in some embodiments a preferred manner of tuning the system reflectors 208A, 208B to system geometry and optics. The tuning is performed for achieving very-high quality light and color output—i.e., maximizing reflectivity and minimizing color separation.

Other reflector 208A, 208B characteristics that can be tuned, to the geometry and optics of the lighting system 200, for achieving the same goals—very-high quality light and color output—are also represented in the dashed block 406 of FIG. 4.

Block 410 represents tuning a number of thin-film layers (e.g., alternating between high and low refractive index dielectric layers) to the geometry and optics of the lighting system 200. This tuning 410 too would be performed toward achieving very-high quality light and color output—i.e., maximizing reflectivity and minimizing color separation.

Block 412 represents tuning a material of the thin-film layers to the geometry and optics of the lighting system 200. This tuning 412 would also be performed toward achieving very-high quality light and color output—i.e., maximizing reflectivity and minimizing color separation.

Block 414 represents tuning a shape of a reflector (e.g., shape of a stack) to the geometry and optics of the lighting system 200, toward the same goals.

Though not shown by separate blocks within the tuning operation section 406, one skilled in the art will appreciate that the tuning 406 can include tuning other reflector characteristics, beyond stack thickness (408) and the others referenced (410, 412, 414), within the scope of the present technology, toward the stated goals—e.g., achieving very-high quality light and color output.

Continuing with the flow 400 of FIG. 4, at block 416, a final design of the lighting system is determined. The final design can be reached based on (i) input from the operations of obtaining the basic system design features, at step 404 (e.g., configuration and arrangement (positioning and orientation) of the light source and reflectors, etc.) and (ii) the dependent, tuned, characteristics of step(s) 406—e.g., the thickness of the stacks 208A, 208B as tuned in step 410.

At block 418, the lighting system can be produced, or constructed accordingly.

The final oval 419 indicates that the method may end or be repeated, such as in connection with a different lighting system.

Illustrative Benefits and Advantages

Benefits of the present technology comprise achieving the goals mentioned, including very-high quality light and color output—i.e., maximizing reflectivity and minimizing color separation.

Figure 1:
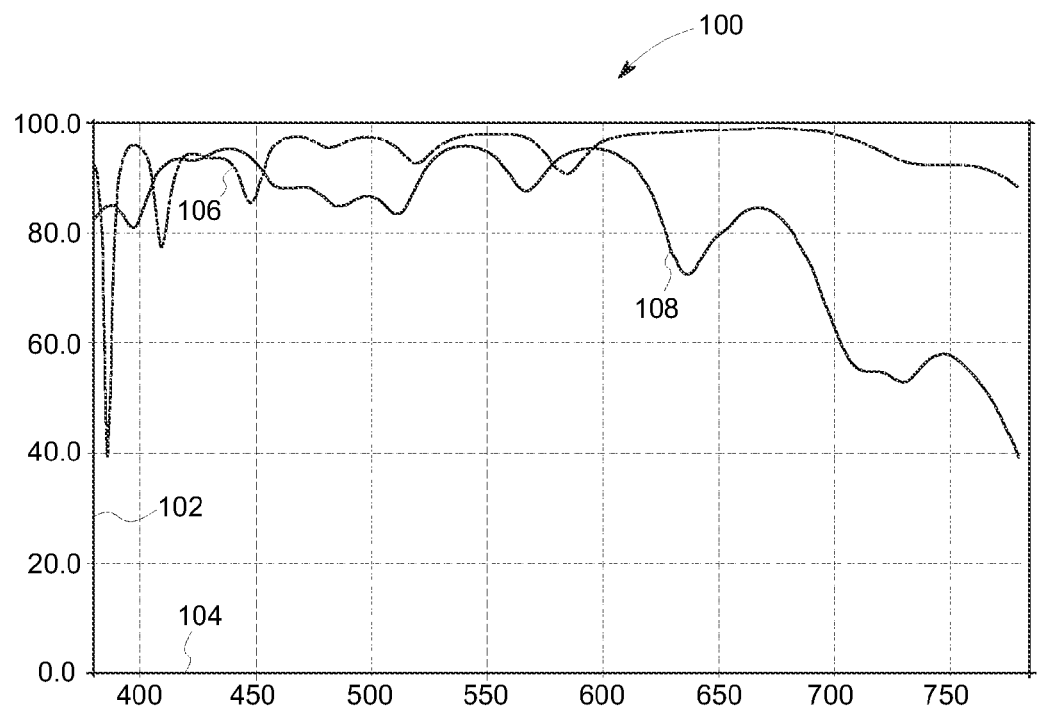
FIG. 1 is a chart showing reflectance vs. wavelength of two instances of reflected light, one being incident at a lower angle to a reflector and the other being incident at a higher angle to the same reflector.

The first figure, FIG. 1, was described above as a chart illustrating detriments of conventional systems, showing quality of two instances of reflected light, one being incident at a more perpendicular angle to a reflector and the other being incident at a more glancing angle to, according to a prior art approach, the same reflector. More particularly, FIG. 1 shows that while reflectivity 102 (y-axis value) for a first light ray 106, incident on a reflector at 60° (where 90° is perpendicular to the reflector surface), remains high for even its higher, more red, wavelengths, reflectivity for a second ray 108, incident on the same reflector at 15°, is much less efficient in connection with the higher wavelengths. The result is undesirable color, including insufficient red light, and so less overall reflectivity and uniformity for the light 108 reflecting at the lower angle.

FIG. 5 is a chart 500 showing example benefits of using high-performance reflectors designed according to the present technology. The chart 500, like that 100 of FIG. 1, shows reflectance (y-axis 502), or percentage of light reflected, of light at various wavelengths (x-axis 504) of two rays of light. The light of each ray can have essentially the same qualities (e.g., color distribution), or be distinct.

A definite difference between the chart 100 of FIG. 1 and that 500 of FIG. 5 is that that each instance of light 506, 508 referenced in the latter impinges on respective high-performance reflectors, tuned particularly for incident angle and type (e.g., color layout) of light 506, 508. The tuning is performed according to the teachings, herein (e.g., tuning reflector stack thickness). A first 506 of the two light rays impinges on a first, tuned, reflector at 60°, while a second ray 508 impinges on a second, tuned, reflector at 15°.

As shown in FIG. 5, then, a relatively high percentage of both instances of the light 506, 508 (i.e., the light at both angles) are reflected at relatively high levels for at least primary color ranges, e.g., between about 425 nm and over 650 nm wavelengths, due to the respective, tuned reflectors configured and used according to the present technology.

The goal of very-high quality light and color output—i.e., maximizing reflectivity and minimizing color separation—is thus achieved.

While other reflector configurations may be used, there are advantages to using a thin-film arrangement, and dielectric coatings therein. One advantage is that dielectric coatings are extremely robust to temperature and environment, especially compared, e.g., to materials such as polymers.

The present technology can also be implemented at relatively low costs of production. Existing design and manufacturing hardware and equipment, and some software, can be used, for instance.

Opportunities for better reflective lighting according to the present technology comprise area lighting applications including outdoor lighting, such as in fixtures for parking lots, parks, boardwalks, stadiums, highways and other roadways, etc. Lighting systems of the present technology can also be used in other manners, such as for indoor applications and in automotive or other transportation vehicles.

VI. CONCLUSION

Those skilled in the art, particularly in light of the foregoing teachings, may make alternative embodiments, examples, and modifications that would still be encompassed by the technology. Further, it should be understood that the terminology used to describe the technology is intended to be in the nature of words of description rather than of limitation.

Those skilled in the art will also appreciate that various adaptations and modifications of the preferred and alternative embodiments described above can be configured without departing from the scope and spirit of the technology. Therefore, it is to be understood that, within the scope of the appended claims, the invention may be practiced other than as specifically described herein.

We claim:

1. A multi-reflector lighting apparatus, comprising:
   a first reflector having a first thin-film reflective stack, wherein the first reflector, when positioned for operation within the apparatus, will reflect light arriving at a first incident angle from a light source; and
   a second reflector having a second thin-film reflective stack, wherein the second reflector, when positioned for operation within the apparatus, will reflect light arriving at a second incident angle from the light source;
   wherein the first and second thin-film reflective thin-film reflective stacks include corresponding reflective characteristics tunable as a function of at least one of a plurality of factors associated with the lighting system; and
   wherein the reflective characteristic of the first thin-film reflective stack is tunable independently from the corresponding reflective characteristic of the second thin-film reflective stack.

2. The multi-reflector lighting apparatus of claim 1, further comprising the light source including multiple light emitting diodes.

3. The multi-reflector lighting apparatus of claim 2, wherein:
   the first incident angle is within a relatively high angle range; and
   the second incident angle is within a relatively low angle range.

4. The multi-reflector lighting apparatus of claim 3, wherein:
   the relatively high range comprises angles between about 45° and about 90°; and
   the relatively low angle range comprises angles between about 0° and about 30°.

5. The multi-reflector lighting apparatus of claim 1, wherein tuning of each of the corresponding reflective characteristics is a function of a location of the respective first and second thin-film reflective stack and a geometry of the light source.

6. A multi-reflector lighting apparatus, comprising:
   a first reflector having a first thin-film reflective stack configured for reflecting light arriving at a first angle from a light source; and
   a second reflector having a second thin-film reflective stack configured for reflecting light arriving at a second angle from the light source;
   wherein the first and second thin-film reflective thin-film reflective stacks include corresponding reflective characteristics tunable as a function of at least one of a plurality of factors associated with the lighting system; and wherein the reflective characteristic of the first thin-film reflective stack is tunable independently from the corresponding reflective characteristic of the second thin-film reflective stack.

\* \* \* \* \*